(12) United States Patent
Humphrey

(10) Patent No.: US 6,741,106 B2
(45) Date of Patent: May 25, 2004

(54) PROGRAMMABLE DRIVER METHOD AND APPARATUS FOR HIGH AND LOW VOLTAGE OPERATION

(75) Inventor: Guy Harlan Humphrey, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/256,048

(22) Filed: Sep. 26, 2002

(65) Prior Publication Data

US 2004/0061533 A1 Apr. 1, 2004

(51) Int. Cl.[7] .................................................. H03B 1/00
(52) U.S. Cl. ........................ 327/108; 327/112; 326/83
(58) Field of Search .......................... 327/108–112, 170, 327/379, 389, 403, 404, 185, 333; 326/81, 82, 83, 87, 68, 57, 58, 23–27

(56) References Cited

U.S. PATENT DOCUMENTS

| | | | | | |
|---|---|---|---|---|---|
| 6,051,995 | A | * | 4/2000 | Pollachek | 326/87 |
| 6,072,333 | A | * | 6/2000 | Tsukagoshi et al. | 326/58 |
| 6,323,704 | B1 | * | 11/2001 | Pelley et al. | 327/112 |
| 6,566,909 | B2 | * | 5/2003 | Okumura | 326/68 |

* cited by examiner

Primary Examiner—Long Nguyen

(57) ABSTRACT

A pad driver method and apparatus is presented. The pad driver includes a dual path configuration. The dual path includes a first path and a second path. Both paths include a pre-driver. The first path and the second path communicate high voltage signals and low voltage signals. The pre-driver in the first path drives a pFET device. The pre-driver in the second path drives an nFET device. The pFET and nFET devices provide an output signal, which drives a pad. Each pre-driver further includes a first path and a second path. The first path in the pre-driver supports high voltage operation and the second path in the pre-driver supports low voltage operation.

8 Claims, 6 Drawing Sheets

PROGRAMMABLE DRIVER METHOD AND APPARATUS FOR HIGH AND LOW VOLTAGE OPERATION

BACKGROUND OF THE INVENTION

1. Field of the Invention

This invention relates to circuits.

2. Description of the Related Art

Modern integrated circuits or chip technology utilizes a number of logic circuits implemented with transistor technology. For example, Field Effect Transistors (FET's) and Complementary Metal-Oxide Semiconductors (CMOS) are often used. The logic circuits are combined and implemented in microprocessors, memories and application specific integrated circuits (ASICs). The microprocessors, memories and ASICS are typically implemented in a chip, which may then be implemented in a larger circuit such as a circuit board. Pins are used to connect between the chip and the circuit board. The pins often make contact with a metal contact on the circuit board known as a pad. As a result, signals may be communicated between the chip and the larger circuit board through the pin and pad.

There is often a need to communicate different signals between the chip and the circuit board using the same pin and pad. Communicating signals off of the chip and onto the pad is known as driving the pad. The circuits that generate these signals are often referred to as pad drivers or pad driving circuits. For example, there may be a need to drive a pad with different signals such as a first signal with a first voltage and a second signal with a second voltage.

To accomplish this objective, modern designers often use a mixture of different logic elements (e.g., FET's). For example, conventional implementations may use two different types of FET's. The first type of FET is a high voltage FET which can tolerate large voltage swings. The high voltage FET is optimized to handle the large voltage swings and to tolerate the outside environment, since there is a need to communicate with the outside world (e.g. circuit board). The second type of FET is a low voltage FET used internally to the chip. The low voltage FET is typically optimized for speed. The various FET's are relatively large devices that carry a large amount of capacitance. As a result, there is a need for a pre-driver to drive these FET's. However, with conventional technology it is difficult to implement a single type of pre-driver, which has good performance and can properly produce a low voltage signal as well as a high voltage signal.

In prior art systems a single type of pre-drive circuit is implemented to drive the lower voltage as well as the higher voltage. However, the high voltage FET's do not work well at the lower voltage, therefore performance is degraded in the pre-drive circuit. In addition, the low voltage FET's have to tolerate high voltage without sustaining damage to the FET. As a result, it is costly and complicated to introduce both high voltage FET's and low voltage FET's in the same design. Lastly, with the advent of modern designs, the difference between the required high voltage and low voltage is a 2x difference, where it was previously less than 1x difference.

Thus there is a need in the art for a pad driver, which can produce both high voltages and low voltages. There is a need for a pad driver implemented with high voltage FET's and optimized to produce both high voltages and low voltages. Lastly, there is a need for a pad driver that can produce a high voltage that is a multiple of two times the low voltage, using high voltage FET's.

SUMMARY OF THE INVENTION

In one embodiment of the present invention, input/output or pad drivers are developed which are used to produce at least two distinct output voltages from a chip. In another embodiment of the present invention, the output voltages have a large voltage range such as a 2x voltage swing. For example, a low voltage of 1.5 volts and a high voltage of 3.3 volts are implemented. In the present invention, a pad driver is optimized to produce a low voltage of 1.5 volts and a high voltage of 3.3 volts. Since the pad driver is programmed to produce 3.3 volts or 1.5 volts, high voltage FET's are implemented to accommodate this voltage range.

The pad driver implemented in accordance with the teachings of the present invention uses at least two pre-driver circuits to accommodate large voltage swings. Both pre-drivers are optimized to accommodate both high and low voltage swings. During one mode of operation a high voltage path in each pre-driver circuit is disabled when generating a low voltage signal and a low voltage path in each pre-driver circuit is disabled when generating a high voltage signal.

In another embodiment of the present invention a method of operating a pad driver comprises the steps of generating an input signal; generating a first voltage from a first pre-driver in response to the input signal, the first voltage driving a first device and causing the first device to operate producing a first signal; generating a second voltage from a second pre-driver in response to the input signal, the second voltage driving a second device and causing the second device to operate producing a second signal; and generating an output voltage in response to the first signal and in response to the second signal.

In one embodiment of the present invention, a pad driver comprises an input generating an input signal; a first pre-driver coupled to the input and generating a first pre-driver signal in response to the input signal from the input; a second pre-driver coupled to the input and generating a second pre-driver signal in response to the input signal from the input; a first output device coupled to the first pre-driver and generating a first output signal in response to the first pre-driver signal generated by the first pre-driver; a second output device coupled to the second pre-driver and generating a second output signal in response to the second pre-driver signal generated by the second pre-driver; and an output node coupled to the first output device and coupled to the second output device, the output node generating a pad signal in response to the first output signal generated by the first output device and in response to the second output signal generated by the second output device.

The pad driver comprises a first enable input generating an enable signal; a second enable input generating a compliment to the enable signal; the first pre-driver coupled to the enable input and the compliment input and generating the first pre-driver signal in response to the enable signal and in response to the compliment of the enable signal.

The pad driver further comprises an enable input generating an enable signal; and a compliment input generating a compliment to the enable signal; the second pre-driver coupled to the enable input and the compliment input and generating the second pre-driver signal in response to the enable signal and in response to the compliment of the enable signal.

The first pre-driver comprises an input generating input information; an inverting level shifter coupled to the input and generating inverted input information; a tri-state inverter coupled to the inverting level shifter and generating first state information in response to the inverted input information; a tri-state buffer coupled to the input and generating second state information in response to the input information; and an output node coupled to the tri-state inverter and coupled to the tri-state buffer, the output node generating output information in response to the first state information and in response to the second state information.

The second pre-driver comprises an input generating input information; an inverting level shifter coupled to the input and generating inverted input information; a tri-state inverter coupled to the inverting level shifter and generating first state information in response to the inverted input information; a tri-state buffer coupled to the input and generating second state information in response to the input information; and an output node coupled to the tri-state inverter and coupled to the tri-state buffer, the output node generating output information in response to the first state information and in response to the second state information.

In another embodiment, the pad driver comprises multiple paths; each path of the multiple paths including at least one pre-driver; and each of the at least one pre-driver including a high voltage path and a low voltage path.

DESCRIPTION OF THE INVENTION

Figure 1:
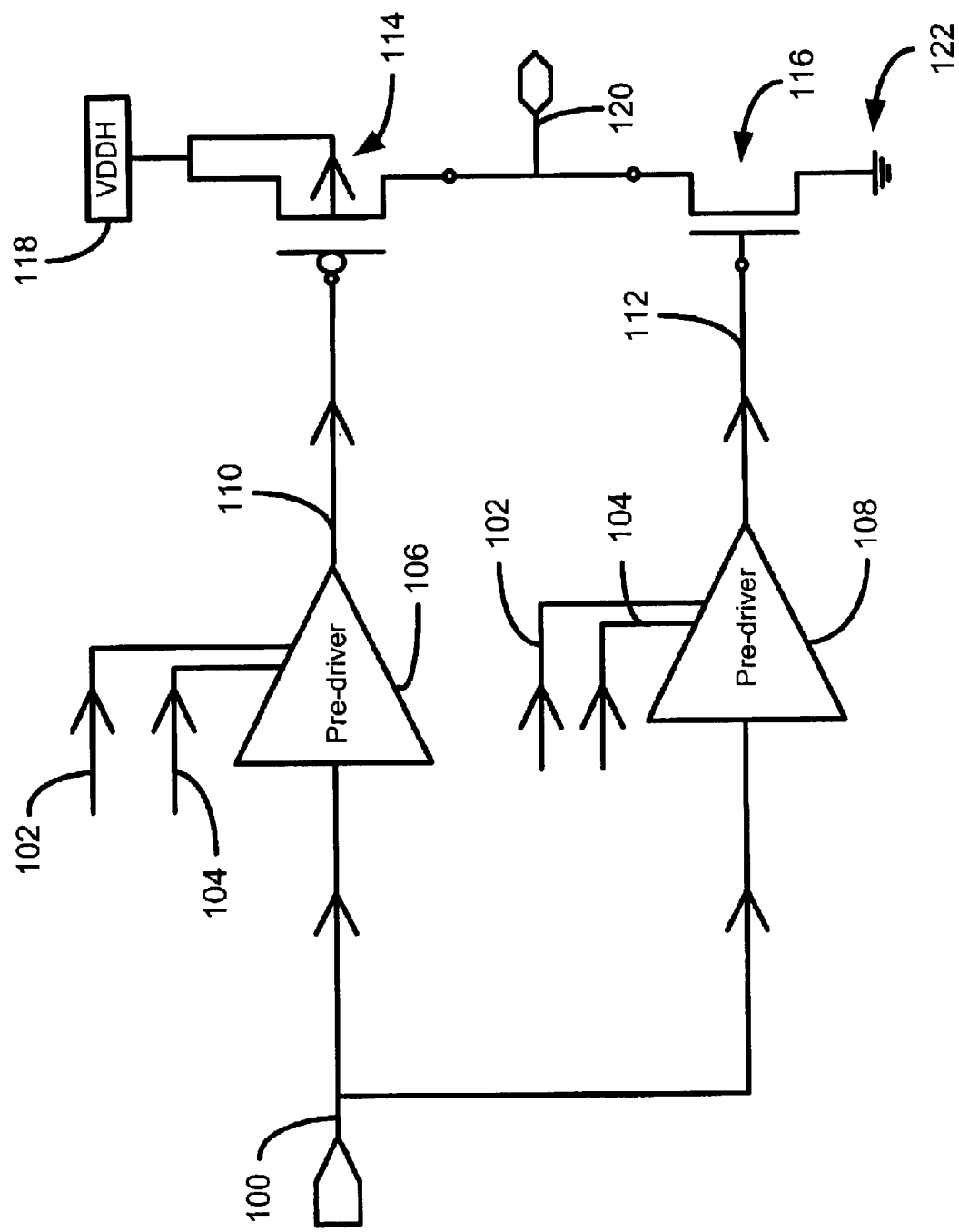
FIG. 1 displays a pad driver circuit implemented in accordance with the teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

In one embodiment of the present invention a pad driver circuit (e.g., pad driver) is implemented on a chip. The pad driver circuit includes pre-driver circuits, which drive a final stage of the pad driver circuit. In one embodiment of the present invention, the final stage of the pad driver circuit includes an output pFET device and an output nFET device. The output pFET device and the output nFET device in the final stage are large devices with a significant amount of capacitance. As a result, a pre-driver circuit is implemented in the pad driver circuit to build up the drive strength (e.g., signal strength) before the final stage. The Pre-driver turns off driving elements before other driving element are turned on. Therefore, the pre-drive circuit is used to build drive strength and to also make sure that the output FET's are not on at the same time.

The pad driver circuit includes dual paths. Each path includes a pre-drive circuit (e.g. pre-driver) that drives the last stage of the pad driver circuit. In one embodiment of the present invention there are two paths (e.g., a first path and a second path). Both paths may communicate a high voltage or a low voltage. The last stage of the pad driver circuit includes two FET's a pFET and an nFET. The pFET is connected to the first path and the nFET is connected to the second path. The pFET may receive a high or low voltage signal on the first path and the nFET may receive a high or low voltage signal on the second path. A high voltage or a low voltage is communicated on the first or second path based on an enable signal input to the pre-driver. The last stage of the pad driver circuit produces an output signal that is communicated off of the chip. In addition, each pre-driver is implemented with a circuit that has two paths. The first path of each pre-driver circuit is operational during high voltage operation and the second path of each pre-driver circuit is operational during low voltage operation. Although dual paths are described and discussed it should be appreciated that multiple paths with multiple pre-drivers may also be implemented and remain within the scope of the present invention. In addition, each pre-driver may also be implemented with multiple low and high voltage path in various permutations and combinations.

In one embodiment of the present invention, both paths are used to provide an output signal at an appropriate voltage level. The pad driver circuit is optimized for performance at two different voltage levels. For example, in one embodiment of the present invention a high voltage signal of 3.3 volts and a low voltage signal of 1.5 volts are implemented. Both paths are implemented in combination to provide optimized performance at the two voltage levels. For example, the high voltage section operates during high voltage operation, as the voltage is lowered circuit delay may be increased, however, the low voltage path is optimized to operate under these conditions.

In one embodiment of the present invention, the pad driver circuit is optimized to perform at 1.5 volts and 3.3 volts. In another embodiment of the present invention, the sizes of the devices (e.g., the pFET and nFET) are optimized for a specific voltage. For example, using a high voltage of 3.3 volts and a low voltage of 1.5 volts, the sizes of the output pFET and the output nFET in the final stage, are optimized to operate at the various voltage levels. As a result, an appropriate output signal is produced and communicated off of the chip.

FIG. 1 displays a pad driver implemented in accordance with the teachings of the present invention. In FIG. 1 a data input is shown as 100. The pad driver is separated into a first path which may carry a high voltage signal or a low voltage signal and a second path which may carry a high voltage signal or a low voltage signal. The first path is denoted by data input 100, pre-driver 106 and pFET driver path 110. The second path is denoted by data input 100, pre-driver 108 and nFET driver path 112. The first path and the second path provide input to output pFET 114 and output nFET 116, respectively. Both output pFET 114 and output nFET 116 drive a pad signal denoted by 120. The pre-driver 106 and the pre-driver 108 receive input from an enable signal 102 and the compliment of the enable signal 104. For example, in one embodiment of the present invention, the enable signal 102 is a high-voltage enable signal and the compliment of the enable signal 104 is the compliment of the high voltage enable signal. Voltage and ground are also designated by 118 and 122 respectively.

In FIG. 1 pull-up and pull-down circuits are implemented in two paths. Data input 100 serves as input for pre-drive circuits 106 and 108. One pre-drive circuit is used for the pull-up functionality of the present invention and one pre-drive circuit is used for the pull-down functionality of the present invention. Output pFET 114 and output nFET 116 are the output FET's that drive off the interface pin of the chip and pull the current communicated to the pin, high or low. In one embodiment of the present invention, pre-drive circuits 106 and 108 are designed the same, but may be sized differently depending on the capacitance of the output pFET 114 and output nFET 116 in the final stage. In the case of high voltage operation a high voltage power supply is applied to pre-driver 106 and pre-driver 108. In the case of low voltage operation, a low voltage power supply is applied to pre-driver 106 and pre-driver 108.

In FIG. 1 the data input 100 serves as an input to pre-driver 106. Pre-driver 106 outputs a pFET driver signal on pFET driver path 110. The pFET driver signal drives output pFET 114. A pad signal 120 is generated from the final stage (e.g., 114 and 116) of the pad driver. The pad signal 120 travels on a pin, which provides a conduit off of the chip to other circuits and/or chips. The data input 100 also serves as an input to pre-driver 108. Pre-driver 108 outputs an nFET driver signal on nFET driver path 112. The nFET driver signal drives output nFET 116. As mentioned previously, the pad signal 120 is generated from the final stage (e.g., 114 and 116) of the pad driver. The output pFET 114 and the output nFET 116 may act as a switch in the open or close position. When the switch is closed signals flow through output pFET or output nFET, when the switch is open signals do not flow through the switch. The pad signal 120 may be generated by the operation of the first path or the second path. In one embodiment of the present invention, both pre-driver 106 and pre-driver 108 are operational at the same time. An input signal, to enable signal logic, which generates enable signal 102 and the compliment of enable signal 104, determines whether a signal output swing from pre-driver 106 or pre-driver 108 is equivalent to 1.5 volts or 3.3 volts. As a result, the pad signal 120 may result from the operation of the output pFET 114 or the output nFET 116 depending on the mode of operation of the pad driver (e.g., high voltage operation or low voltage operation).

Figure 2:
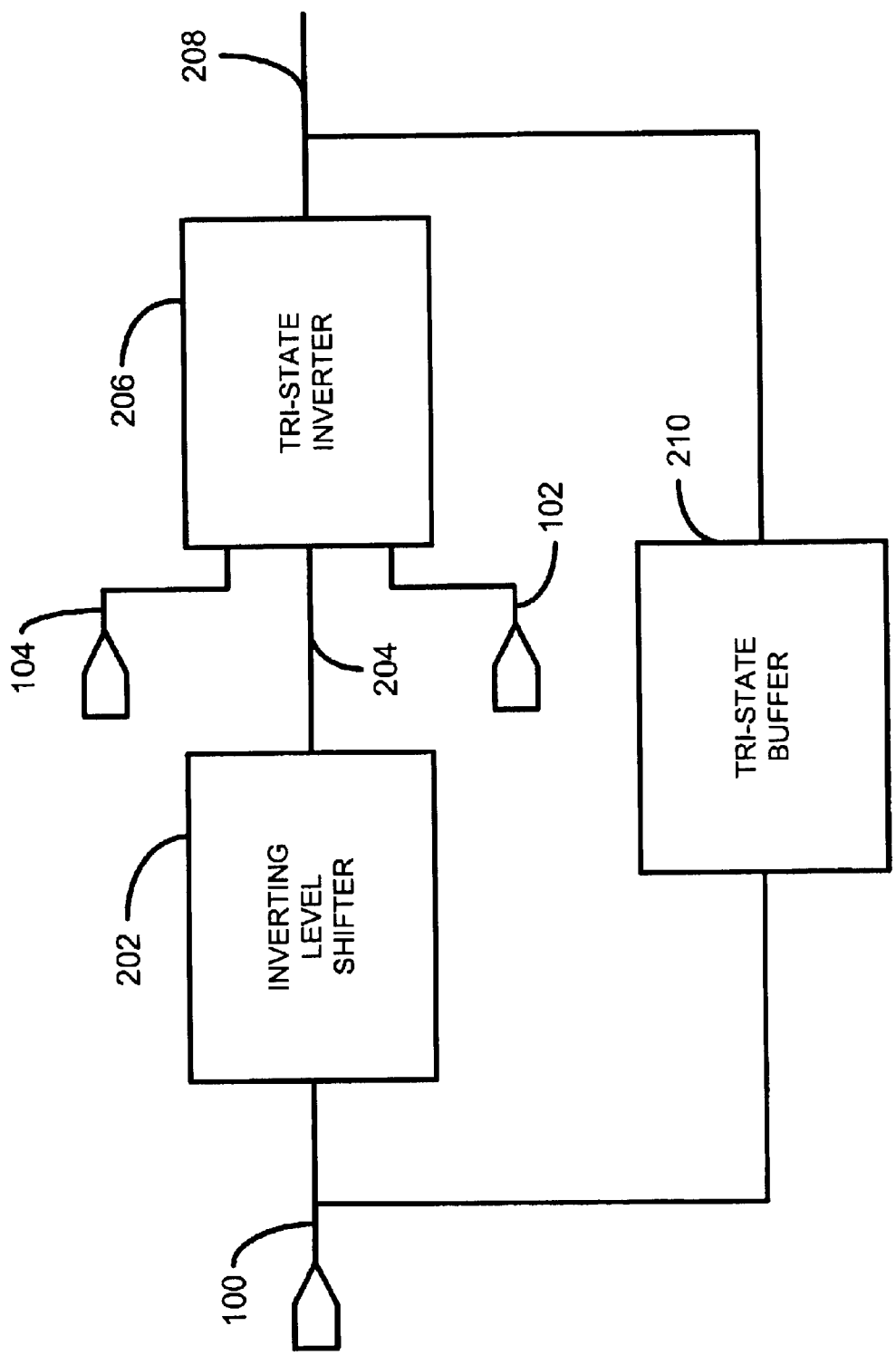
FIG. 2 displays a block diagram of a pre-driver implemented in accordance with the teachings of the present invention.

FIG. 2 displays a block diagram of the pre-drive circuit shown as 106 and 108 of FIG. 1. In FIG. 2 the data input signal 100 provides input data to the pre-drive circuit depicted in FIG. 2. An inverting level shifter 202 and a tri-state buffer 210 receive an input signal from the data input signal 100. The inverting level shifter 202 inverts the data input signal 100 and shifts the voltage level of the data input signal 100 to produce an inverted and level shifted signal at position 204. The inverted level shifted signal at 204, an enabled signal 102 and the compliment of the enable signal 104, serve as input to a tri-state inverter 206. The tri-state inverter 206 and the tri-state buffer 210 combine to produce an output signal 208. In one embodiment of the present invention, the inverting level shifter 202 and the tri-state inverter 206 are optimized for high voltage operations and the tri-state buffer 210 is optimized for low voltage operations. During high voltage operation output signal 208 is dependent on the operation of the inverting level shifter 202 and tri-state inverter 206. In low voltage operation output signal 208 is dependent on tri-state buffer 210.

Figure 3:
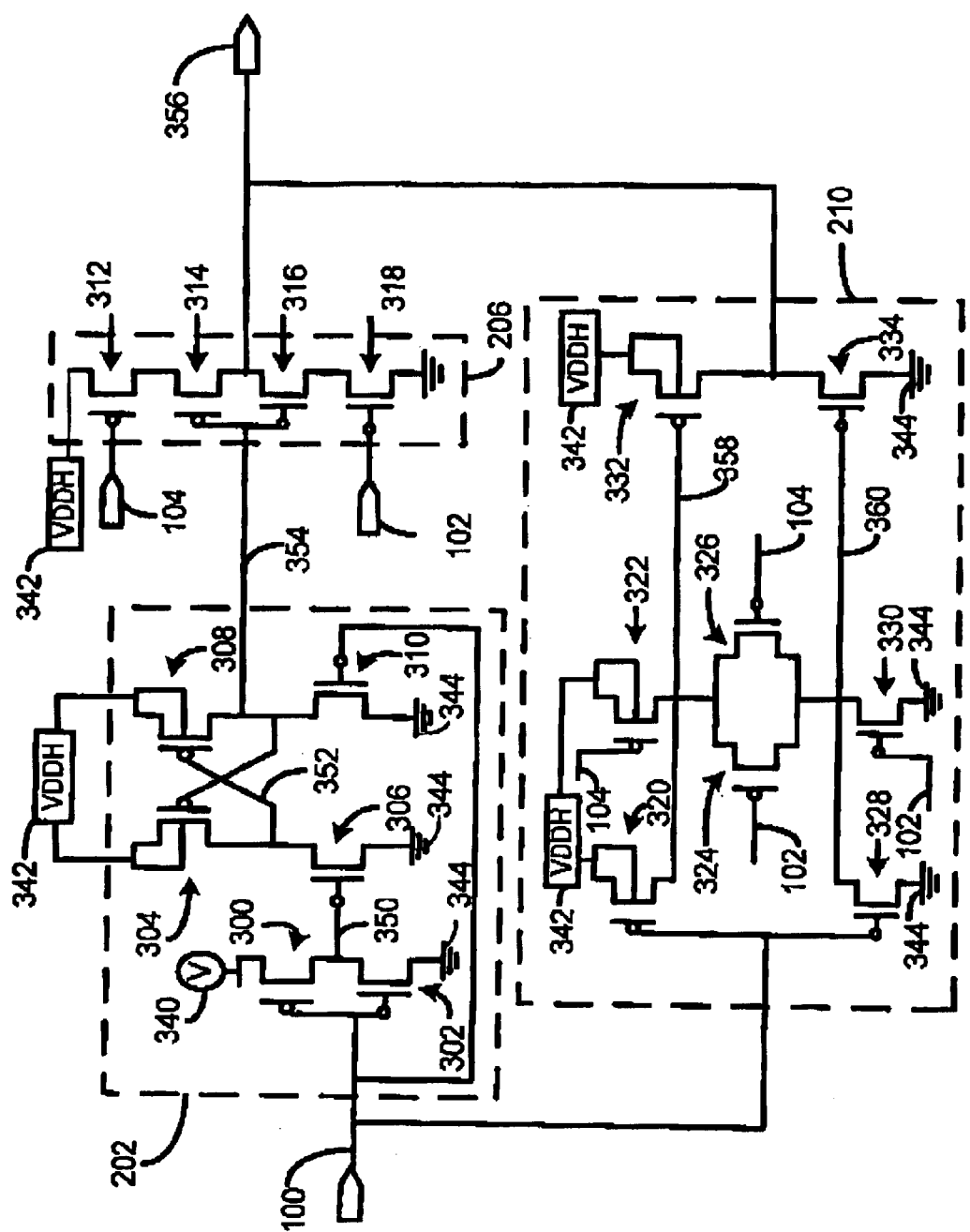
FIG. 3 displays an implementation of a pre-driver, implemented in accordance with the teachings of the present invention.

FIG. 3 displays a detailed view of the pre-driver circuit of FIG. 1 and one implementation of the block diagrams shown in FIG. 2. In FIG. 3 the inverting level shifter 202, the tri-state inverter 206 and the tri-state buffer 210 are shown.

In FIG. 3, a core power supply 340 and a programmable power supply 342 (e.g. VDDH) are implemented. The programmable power supply 342 is programmed to either 1.5 volts or 3.3 volts in the present embodiment. The core power supply is set to the lower power value of 1.5 volts.

Data input 100 comes into the circuit and is inverted by an inverter unit, which consists of pFET 300 and an nFET 302. The inverter (e.g. 300, 302) creates inverted data 350, which is an inverted version of the data input 100. The inverted data 350 is then used as an input for a level shifter, which includes pFET 304, pFET 308, nFET 306 and nFET 310. The level shifter is configured in a cross-coupled configuration with nFET 306 connected to pFET 308 and nFET 310 connected to pFET 304. During operation, if the inverted data 350 is high, the nFET 306 over-drives the current state of the pFET 304, since both pFET's (e.g, 304 and 308) are sized to be much weaker than the nFET's (e.g., 306 and 310). As a result, the nFET 306 pulls down a negative signal at a position shown as 352. Since the negative signal at position 352 is low this causes the pFET 308 to pull up a signal at position 354. Consequently, the nFET's (e.g., 306, and 310) pull down and overpower the signal on the pFET's (e.g., 304 and 308) and the pFET's then pull up the signal conducted on line 354. This is known as level shifting and the cross-coupled configuration of the nFET's (e.g., 306 and 310) and the pFET's (304 and 308) are referred to as a level shifter. The level shifter takes a low voltage signal (e.g., 350) and then transforms it to a high voltage signal (e.g., 354). Since the level shifter is designed in a cross-coupled configuration, the level shifter requires the input signal (100) and the compliment of the input signal (350). The inverter (e.g., 300 and 302) is used to take the input data 100 and produce and inverted data input 350, which is an inverted version of the input data 100. The level shifter produces the signal 354, which is an inverted high voltage version of the data input 100. The signal then drives the final stage (e.g., the tri-state inverter 206) of the pre-driver. The tri-state inverter includes components 312, 314, 316, 318 and receives signal 354, enable signal 102 and the compliment of the enable signal 104. The tri-state inverter 206 is then used to drive the final stage of the pad driver circuit shown in FIG. 1. Consequently, the tri-state inverter is used to drive the output pFET 114 (e.g. pull-up FET) or the output nFET 116 (e.g., pull-down) shown in FIG. 1, when the pre-driver (e.g., 106 or 108 of FIG. 1 are operating in high voltage mode).

In one embodiment of the present invention, the enable signal 102 and the compliment of the enable signal 104 are used to enable the tri-state inverter 206. For example, in 3.3 volt operation the enable signal 102 would be high so a logical one would be applied to the nFET 318 and a zero would be applied to the pFET 312. This would enable the tri-state inverter 206 to pull-up and pull-down an output signal on an output node 356. The output signal is then used to drive the final pull-up or pull-down FET's shown as 114 and 116 of FIG. 1 respectively.

A tri-state buffer is also implemented in the pre-driver shown in FIG. 3. The tri-state buffer 210 is used during low voltage operation Therefore, during high voltage operations a first path consisting of the data input 100, the inverting level shifter 202 and the tri-state inverter 206 are operational. During low voltage operation, a second path including the data input 100 and the tri-state buffer 210 are operational. During one operational mode of the present invention, the first path is operational and the second path is disabled or tri-stated. During a second operational mode of the present invention, the second path is operational and the first path is disabled or tri-stated.

During operation of the tri-state buffer 210, the data input signal 100 serves as input to the tri-state buffer 210 and enters the first stage (e.g., 320 and 328) of the tri-state buffer 210. As shown in FIG. 3, the first stage is powered by the high voltage power supply 342, which is 3.3 volts in one embodiment of the present invention. During low voltage operation, the compliment of the enable signal 104 is high and the enable signal 102 is low. With this signaling on the respective inputs, first node 358 and second node 360 are connected through the transmission gates composed of pFET 324 and nFET 326. As a result of the connection between the first node and the second node, 358 and 360 respectively, pull-up FET 322 and pull-down FET 330 are disabled. They are out of the system. During low voltage operation, the data input 100 comes in at a low voltage, under the control of the low voltage power supply 342 and the tri-state buffer functions like two back to back inverters. The first stage (e.g., 320 and 328) invert the input data signal 100 and the next stage (e.g., 332, 324, 326 and 340) inverts the data input signal 100 back to its original value. To tri-state the tri-state buffer 210, the enable signal 102 and the compliment of the enable signal 104, disable the transmission gates (e.g., 324 and 326) between the first node 358 and the second node 360.

When the transmission gates 324 and 326 are disabled, the connection is then opened. As a result, FET 322 (e.g., pull-up FET) is enabled and it pulls up the node 358 to a one, which then turns off the pFET 332 so that nothing from this stage is driving the output node 356, which in turn tri-states the system. In addition, nFET 330 pulls down the second node 360, which then turns off the last stage nFET 334, so once again, nothing from this stage drives the output node 356.

Figure 4:
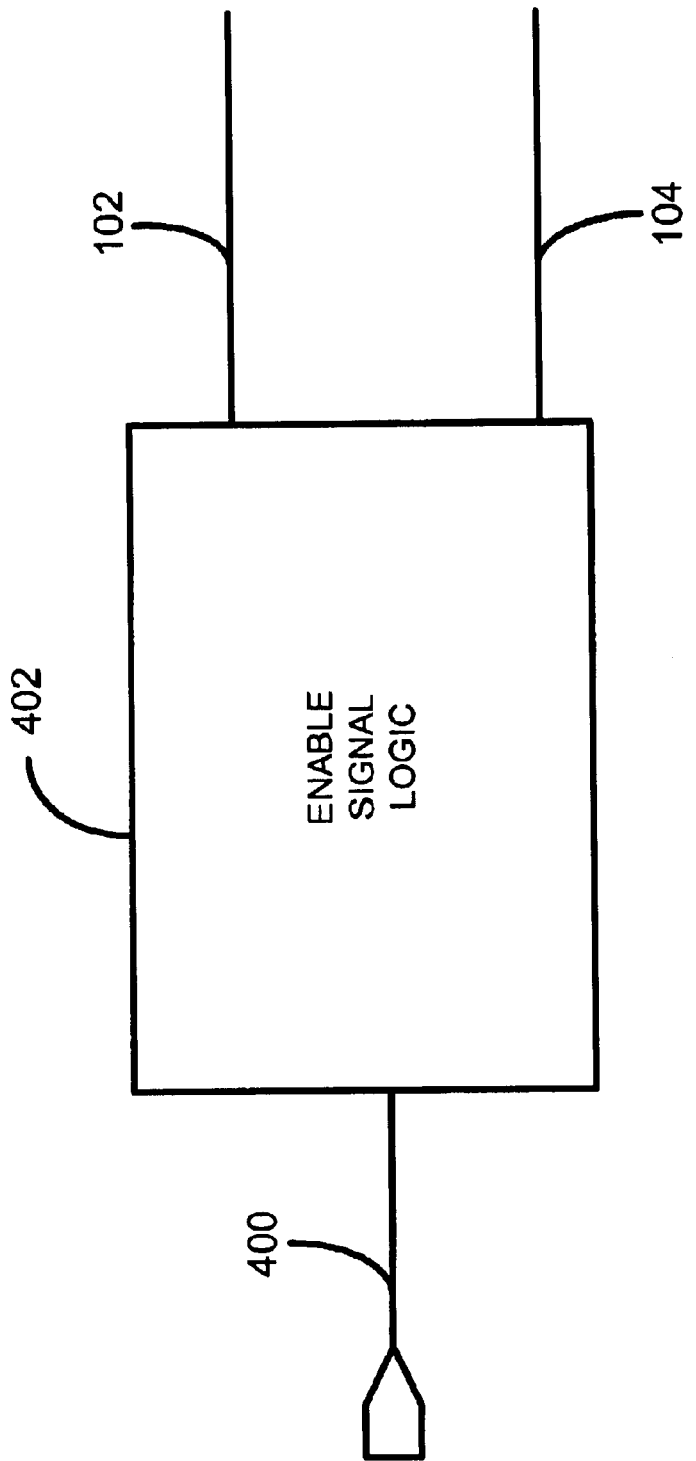
FIG. 4 displays an enable signal circuit implemented in accordance with the teachings of the present invention.

FIG. 4 displays a block diagram showing the enable signal logic, which generates the enable signal 102 and the compliment of the enable signal 104. The enable signal logic 402 receives a voltage input signal 400. The voltage input signal 400 comes in externally to select an operational mode for the enable signal logic 402. For example, when the voltage input signal 400 is high the pad driver drives output node with a high voltage signal when the voltage input signal 400 is low the pad driver drives output node with a low voltage signal.

Figure 5:
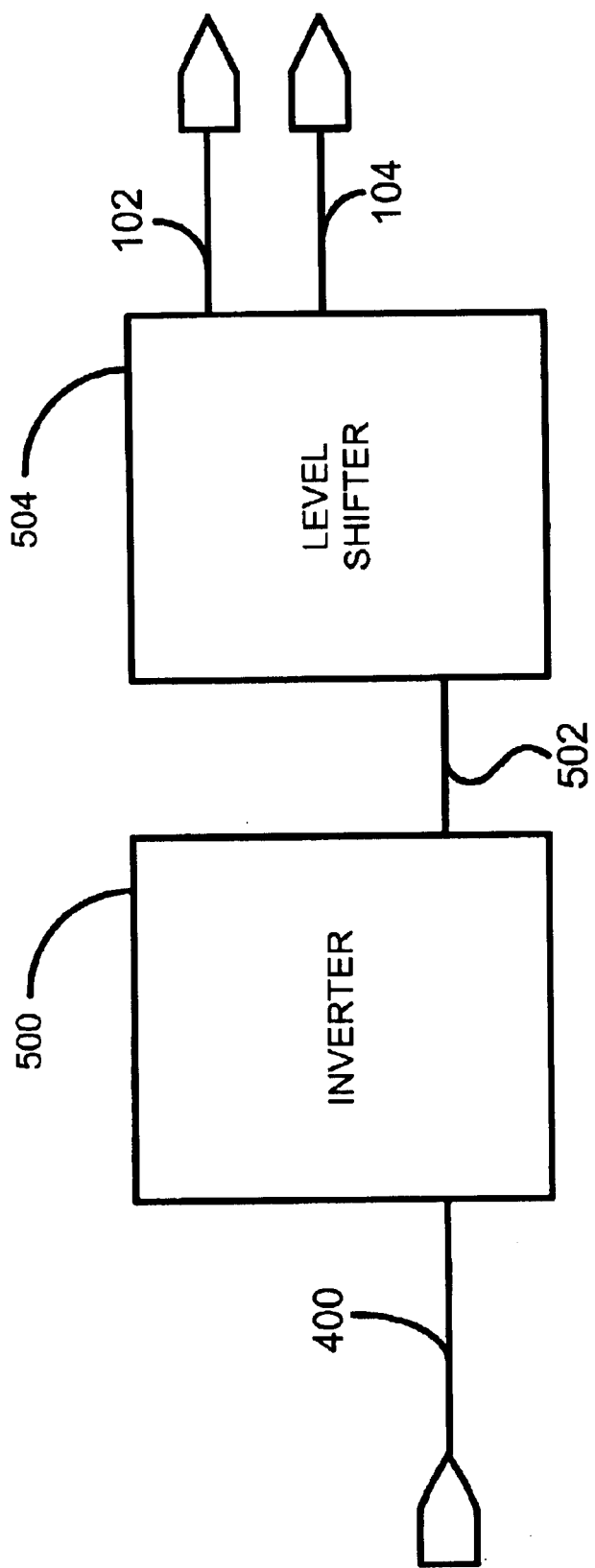
FIG. 5 displays a block diagram of enable signal logic implemented in accordance with the teachings of the present invention.

FIG. 5 displays a block diagram of the enable signal logic 402 shown in FIG. 4. In FIG. 5 an inverter 500 receives a voltage input signal 400 and inverts the voltage input signal. An inverter 500 inverts the voltage input signal 400 producing an inverted voltage input signal 502. The inverted voltage input signal 502 serves as an input to a level shifter 504. The level shifter 504 produces an enable signal 102 and the compliment of the enable signal 104.

Figure 6:
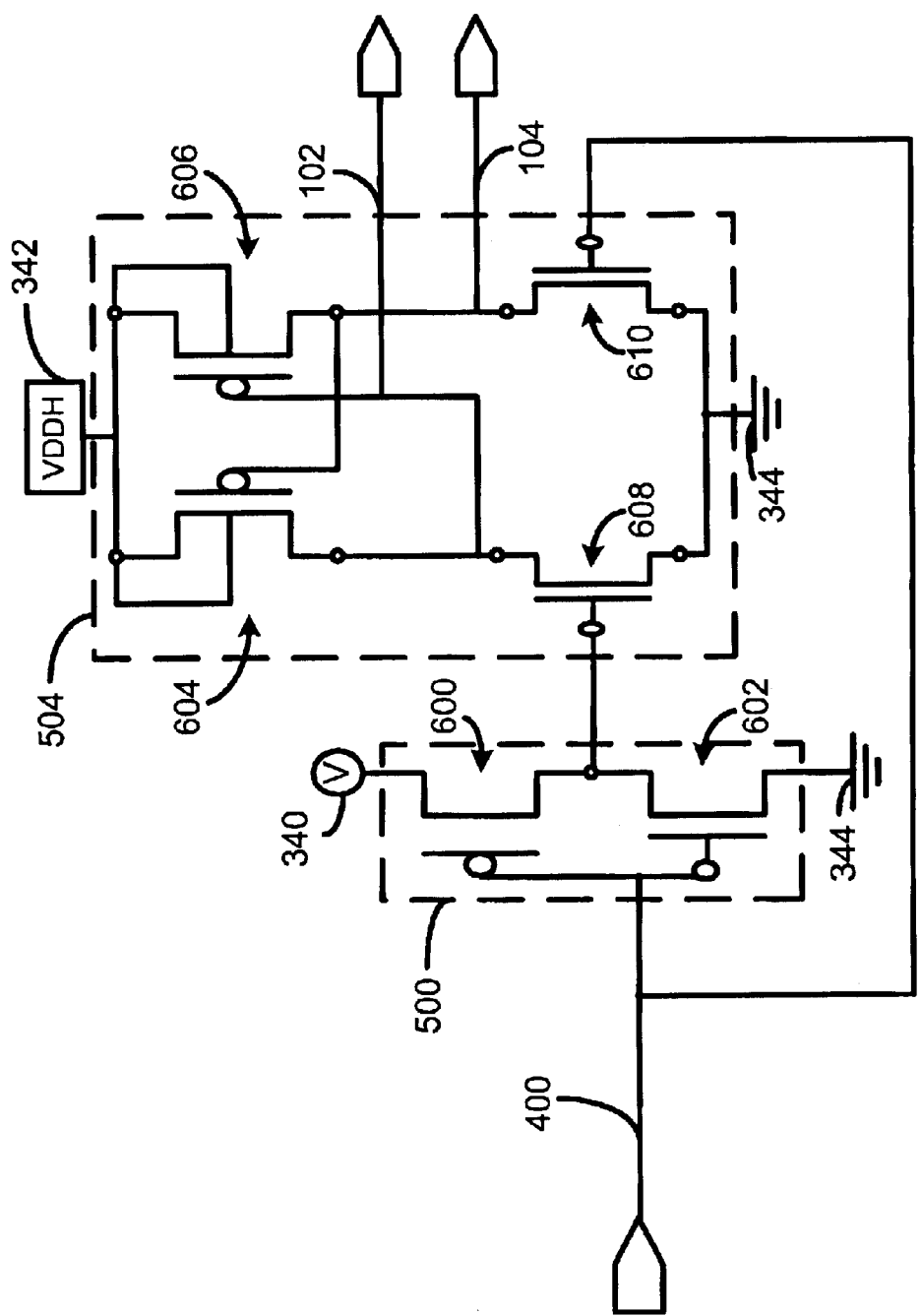
FIG. 6 displays an implementation of the enable signal logic, implemented in accordance with the teachings of the present invention.

FIG. 6 displays a detailed embodiment of the enable signal logic 402 of FIG. 4. The enable signal logic 402 is the circuitry that generates the enable signal 102 and the compliment of the enable signal 104. In one embodiment of the present invention, the circuitry depicted in FIG. 6 includes a level shifter that generates both positive and negative voltage values. When the voltage input signal 400 is high, the enable signal logic of FIG. 6 is in high voltage operation and the power supply 342, which is connected to pFET 604 and pFET 606 is a high value. In the present embodiment this is a value of 3.3 volts. During this mode of operation, the enable signal 102 would be transmitted at a high voltage. When the voltage input signal 400 is high the power supply 342 is 3.3 volts and the enable signal 102 and the compliment of the enable signal 104 are 3.3 volts and 0 volts respectively. When the voltage input signal 400 is low the power supply 342 is 1.5 volts and the enable signal 102 and the compliment of the enable signal 104 are 0 volts and 1.5 volts respectively.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A method of operating a pad driver, the method comprising the steps of:

generating an input signal;

generating a first voltage from a first pre-driver, the first pre-driver including a first path, comprising an inverting level shifter and a tri-state inverter, the first path operating during high voltage operations and a second path comprising a tri-state buffer, the second path operating during low voltage operations, the first pre-driver generating the first voltage in response to the input signal, the first voltage driving a first device and causing the first device to operate producing a first signal;

generating a second voltage from a second pre-driver in response to the input signal, the second voltage driving a second device and causing the second device to operate producing a second signal; and generating an output voltage in response to the first signal and in response to the second signal.

2. A pad driver comprising:

means for generating on input signal;

means for generating a first voltage from a first pre-driver means, the first pre-driver means including a first path, comprising an inverting level shifter means and a tri-state inverter means, the first path operating during high voltage operations and a second path comprising a tri-state buffer means, the second path operating during low voltage operations, the first pre-driver generation the first voltage in response to the input signal, the first voltage driving a first logic means and causing the first logic means to operate producing a first signal;

means for generating a second voltage from a second pro-driver means in response to the input signal, the second voltage driving a second logic means and causing the second logic means to operate producing a second signal; and means for generating an output voltage in response to the first signal and in response to the second signal.

3. A pad driver comprising:

an input receiving an input signal;

a first pre-driver including a first path comprising a tri-state inverter and a inverting level shifter, wherein the first path operating during high voltage operations and a second path comprising a tri-state buffer, wherein the second path operating during low voltage operations, the first pre-driver coupled to the input and generating a first pre driver signal in response to the input signal from the input;

a second pre-driver coupled to the input and generating a second pre-driver signal in response to the input signal from the input;

a first output device coupled to the first pre-driver and generating a first output signal in response to the first pre-driver signal generated by the first pre-driver;

a second output device coupled to the second pre-driver and generating a second output signal in response to the second pre-driver signal generated by the second pre-driver; and an output node coupled to the first output device and coupled to the second output device, the output node generating a pad signal in response to the first output signal generated by the first output device and in response to the second output signal generated by the second output device.

4. A pad driver as set forth in claim 3, the pad driver further comprising:

a first enable input receiving an enable signal;

a second enable input receiving a compliment to the enable signal;

the first pre-driver coupled to the enable input and the second enable input and generating the first pre-driver signal in response to the enable signal and in response to the compliment of the enable signal.

5. A pad driver as set forth in claim 3, the pad driver further comprising:

an enable input receiving an enable signal; and a compliment input receiving a compliment to the enable signal;

the second pre-driver coupled to the enable input and the second enable input and generating the second pre-driver signal in response to the enable signal and in response to the compliment of the enable signal.

6. A pad driver comprising:

an input receiving an input signal;

a first pre-driver coupled to the input and generating a first pre-driver signal in response to the input signal from the input the first pre-driver comprising:

an inverting level shifter coupled to the input and generating a level shifter output;

a tri-state inverter coupled to the inverting level shifter and generating first state information in response to the level shifter output;

a tri-state buffer coupled to the input and generating second state information in response to the input signal; and a first pre-driver output node coupled to the tri-state inverter and coupled to the tri-state buffer, the the first-pre-driver output node generating said first pre-driver signal in response to the first state information and in response to the second state information;

a second pre-driver coupled to the input and generating a second pre-driver signal in response to the input signal from the input;

a first output device coupled to the first pre-driver and generating a first output signal in response to the first pre-driver signal generated by the first pre-driver;

a second output device coupled to the second pre-driver and generating a second output signal in response to the second pre-driver signal generated by the second pre-driver; and an output node coupled to the first output device and coupled to the second output device, the output node generating a pad signal in response to the first output signal generated by the first output device and in response to the second output signal generated by the second output device.

7. A pad driver comprising:

an input receiving an input signal;

a first pre-driver coupled to the input and generating a first pre-driver signal in response to be input signal from the input;

a second pre-driver coupled to the input and generating a second pre-driver signal in response to the input signal from the input, the second pre-driver comprising:

an inverting level shifter coupled to the input and generating a level shifter output;

a tri-state inverter coupled to the inverting level shifter and generating first state information in response to the level shifter output;

a tri-state buffer coupled to the input and generating second state information in response to the input signal; and a second pre-driver output node coupled to the tri-state inverter and coupled to the tri-state buffer, the the second-pre-driver output node generating said second pre-driver signal in response to the first state information and in response to the second state information;

a first output device coupled to the first pre-driver and generating a first output signal in response to the first pre-driver signal generated by the first pre-driver;

a second output device coupled to the second pre-driver and generating a second output signal in response to the second pre-driver signal generated by the second pre-driver; and an output node coupled to the first output device and coupled to the second output device, the output node generating a pad signal in response to the first output signal generated by the first output device and in response to the second output signal generated by the second output device.

8. A method of operating a pad driver comprising the steps of:

generating an input signal;

generating an inverted level-shifted signal in response to the input signal;

generating a tri-state inverted signal in response to the inverted level shifted signal;

generating a tri-state buffered signal in response to the input signal;

generating a first pre-driver signal in response to the tri-state inverted signal and in response to the tri-state buffered signal;

generating a second pre-driver signal in response to the input signal;

generating a first output signal in response to the first pre-driver signal;

generating a second output signal in response to the second pre-driver signal; and generating a pad signal in response to the first output signal and in response to the second output signal.

* * * * *